United States Patent
Lee (10) Patent No.: US 10,972,032 B2
(45) Date of Patent: Apr. 6, 2021

(54) METHOD AND APPARATUS FOR DETECTING FAILURE OF CURRENT SENSOR OF MOTOR

(71) Applicant: MANDO CORPORATION, Pyeongtaek-si (KR)

(72) Inventor: Jong Hoon Lee, Incheon (KR)

(73) Assignee: MANDO CORPORATION, Pyeongtaek-si (KR)

( * ) Notice: Subject to any disclaimer, the term of this patent is extended or adjusted under 35 U.S.C. 154(b) by 0 days.

(21) Appl. No.: 16/554,678

(22) Filed: Aug. 29, 2019

(65) Prior Publication Data

US 2020/0076342 A1    Mar. 5, 2020

(30) Foreign Application Priority Data

Sep. 3, 2018    (KR) ........................ 10-2018-0104402

(51) Int. Cl.
| | |
|---|---|
| H02P 21/00 | (2016.01) |
| H02P 21/22 | (2016.01) |
| H02P 21/06 | (2016.01) |
| G01R 19/165 | (2006.01) |
| G01R 35/00 | (2006.01) |
| B62D 5/04 | (2006.01) |

(52) U.S. Cl.
CPC ........ H02P 21/22 (2016.02); G01R 19/16528 (2013.01); G01R 35/00 (2013.01); H02P 21/06 (2013.01); B62D 5/049 (2013.01)

(58) Field of Classification Search
CPC ....... G05B 2219/42329; H02P 29/0241; H02P 29/024; H02P 29/027; H02P 6/28; H02P 6/08; H02P 2205/01
See application file for complete search history.

(56) References Cited

U.S. PATENT DOCUMENTS

2009/0305706 A1* 12/2009 Tomizu ............. H04W 36/0055
                                                                        455/442
2017/0282968 A1* 10/2017 Kezobo ................... H02P 27/06

FOREIGN PATENT DOCUMENTS

| JP | 2002-34266 A | 1/2002 |
|---|---|---|
| JP | 2003-255006 A | 9/2003 |
| JP | 2007-28793 A | 2/2007 |
| JP | 2015-80290 A | 4/2015 |

OTHER PUBLICATIONS

Korean Office Action dated Jul. 16, 2019 in connection with counterpart Korean Patent Application No. 10-2018-0104402.
Korean Office Action dated Jan. 10, 2020 corresponding to Korean Application No. 10-2018-0104402.

* cited by examiner

*Primary Examiner* — Karen Masih
(74) *Attorney, Agent, or Firm* — Hauptman Ham, LLP (57) ABSTRACT

A method and apparatus for detecting a failure of a current sensor measuring the magnitude of a current, by which a motor is driven. A required current calculator calculates a phase and a magnitude of a current required for a motor, in accordance with a torque required for the motor. An estimated current calculator calculates an estimated current, in accordance with the phase and the magnitude of the required current. A failure detector detects a failure of a current sensor by comparing the estimated current with a current measured by the current sensor.

10 Claims, 5 Drawing Sheets

METHOD AND APPARATUS FOR DETECTING FAILURE OF CURRENT SENSOR OF MOTOR

CROSS REFERENCE TO RELATED APPLICATION

This application claims priority from Korean Patent Application No. 10-2018-0104402, filed on Sep. 3, 2018, which is hereby incorporated by reference for all purposes as if fully set forth herein.

BACKGROUND

Field

Embodiments relate to a method and apparatus for detecting a failure of a current sensor measuring the magnitude of a current, by which a motor is driven. More particularly, embodiments relate to a method and apparatus for detecting a failure of a current sensor by calculating an estimated current using information regarding the position of a motor and a calculated current required for the motor and then comparing the calculated estimated current with a value of current measured by the current sensor.

Description of Related Art

Recently, vehicles have been provided with a greater variety of electronic functions, and in response thereto, and a greater variety of electronic devices are disposed and used in vehicles.

Electronic devices disposed in vehicles may include an electronic device for controlling the engine, an electronic device for controlling power transmission, an electronic device for controlling braking, an electronic device for controlling a suspension system, an electronic device for controlling instruments, an electronic device for controlling information communications, an electronic device for controlling pourer/wire harnesses, and the like.

To control such electronic devices, a vehicle is typically provided with an electronic control unit (ECU) receiving electrical signals from a variety of input sensors and outputting digital control signals to drive a variety of actuators on the output side.

An electric power steering (EPS) system, using such an ECU to control the steering power of a steering system depending on the speed of a vehicle, assists in the driver manipulating the steering wheel by controlling the amount of assistance torque by driving the motor. The EPS system sends a command to the motor by calculating an optimal amount of power by the ECU, on the basis of information of a rotation angle sensor, also referred to as a steering angle sensor, other information regarding velocity, and the like.

In addition, there is increasing demand for reliability in electronic devices disposed in vehicles. In this regard, research into solutions related to a redundancy system and a loss-of-assist mitigation (LOAM) method have been undertaken.

As a method of using the LOAM method in the above-described EPS system, sensorless control methods able to provide steering power to a driver, even when a current sensor measuring the magnitude of a current, by which the motor is driven, is provided, have been developed. For effective applications of such sensorless control methods, a method and apparatus for detecting a failure of a current sensor detecting the magnitude of a current, by which the motor is driven, should be provided.

BRIEF SUMMARY

Various aspects provide a method and apparatus for detecting a failure of a current sensor by calculating an estimated current using information regarding the position of a motor and a calculated current required for the motor and then comparing the calculated estimated current with a value of current measured by the current sensor.

According to an aspect, provided is an apparatus for detecting a failure of a current sensor measuring a magnitude of a current, by which a motor is driven. The apparatus may include: a required current calculator calculating a phase and a magnitude of a current required for a motor, based on a torque required for the motor; an estimated current calculator calculating an estimated current, based on the phase and the magnitude of the required current and position information of the motor; and a failure detector detecting a failure of a current sensor by comparing the estimated current with a current measured by the current sensor.

According to another aspect, provided is a method of detecting a failure of a current sensor measuring a magnitude of a current, by which a motor is driven. The method may include: calculating a phase and a magnitude of a current required for a motor, based on a torque required for the motor; calculating an estimated current, based on the phase and the magnitude of the required current and position information of the motor; and detecting a failure of a current sensor by comparing the estimated current with a current measured by the current sensor.

According to exemplary embodiments, it is possible to apply a sensorless control method by efficiently detecting a failure of a current sensor without providing additional hardware or modifying existing hardware in overall operating areas of an electric power steering (EPS) motor.

DESCRIPTION OF DRAWINGS

The above and other objects, features, and advantages of the present disclosure will be more clearly understood from the following detailed description, taken in conjunction with the accompanying drawings, in which.

DETAILED DESCRIPTION

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown different accompanying drawings from one another. Further, in the following description of examples or embodiments of the present disclosure, detailed descriptions of well-known functions and components incorporated herein will be omitted when it is determined that the description may make the subject mat in some embodiments of the present disclosure rather unclear.

Terms, such as "first", "second", "A", "B", "(A)", or "(B)" may be used herein to describe element of the disclosure. Each of these terms is not used to define essence, order, sequence, or number of elements etc., but is used merely to distinguish the corresponding element from other elements. When it is mentioned that first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

Figure 1:
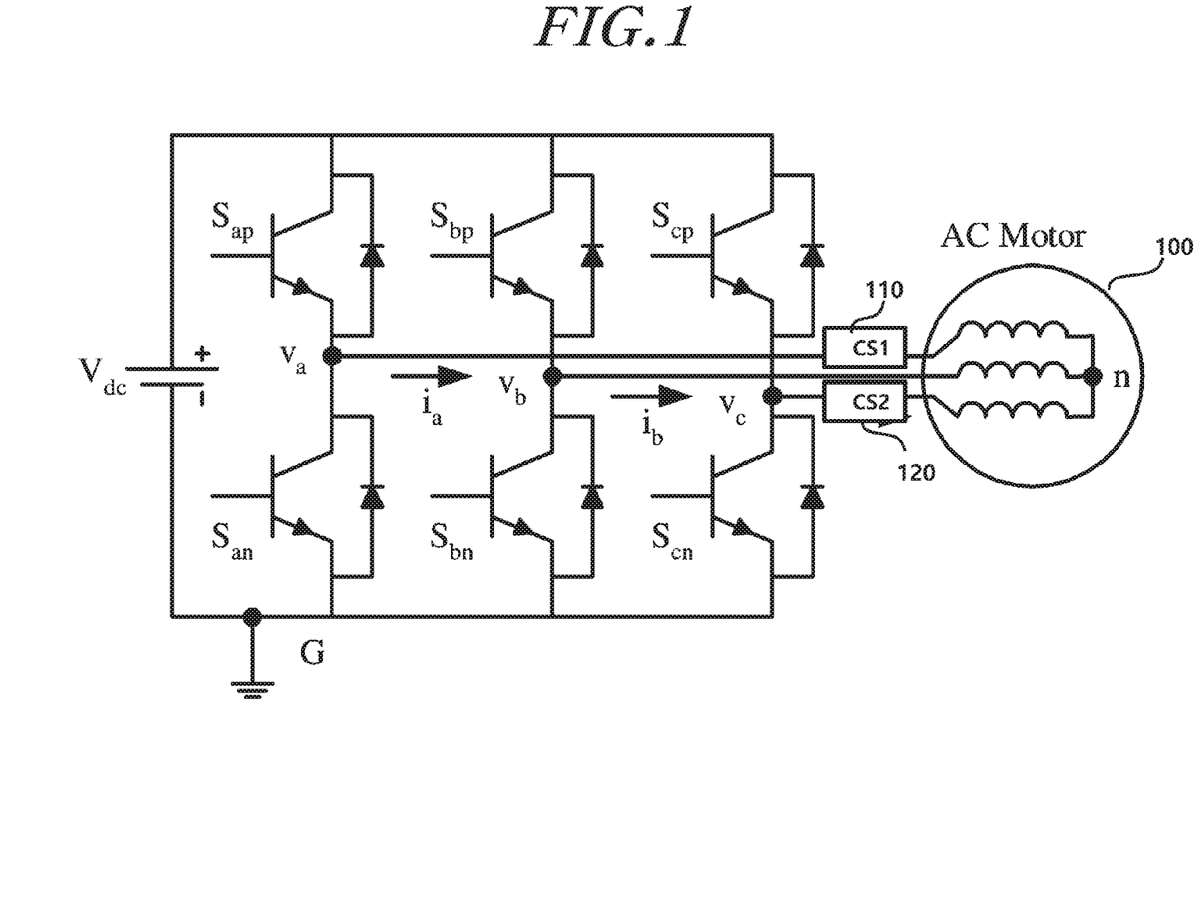
FIG. 1 is a circuit diagram illustrating a configuration of a motor and a current sensor measuring the magnitude of a current by which the motor is driven.

FIG. 1 is a circuit diagram illustrating a configuration of a motor and a current sensor measuring the magnitude of a current by which the motor is driven.

Referring to FIG. 1, a motor current, in the form of an alternating current (AC), is input to a typical three-phase motor 100 through three terminals of the motor 100, referred to as U, V, and W terminals. The motor 100 is driven by the input motor current.

Here, current sensors may be disposed on two terminals among the U, V, and W terminals of the motor 100 in order to measure the magnitude of the current input to the motor 100. Among the two current sensors, the current sensor disposed on one terminal may be referred to as CS1 110, while the current sensor disposed on the other terminal may be referred to as CS2 120.

The current sensors are only disposed on the two terminals among the three terminals, as a total of current flowing through three terminals is zero (0), due to characteristics of AC. That is, when only two currents flowing through the two terminals are measured, a current flowing through the remaining one terminal may be calculated using the currents flowing through the two terminals.

Here, a method of detecting a failure of a current sensor (hereinafter, also referred to as a "current sensor failure detection method") is required in order to determine whether or not values measure by the current sensors, disposed on the two terminals among the three terminals of the motor, are accurate. If a current sensor is detected has having failed, the motor may be driven by a sensorless control method, which has been developed in the related art, to provide steering power to a driver.

Figure 2:
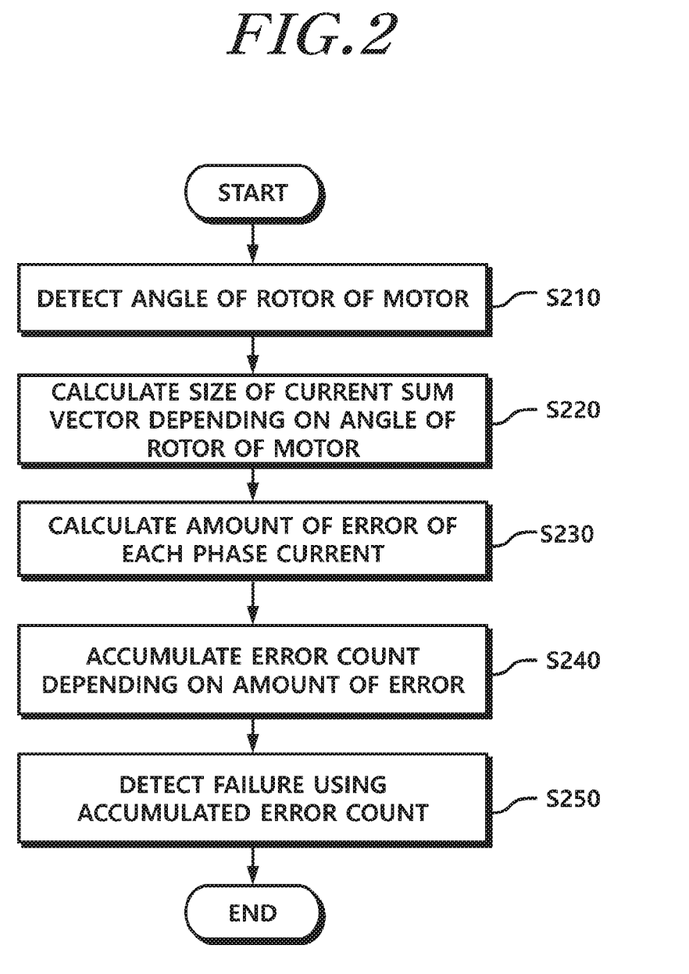
FIG. 2 is a flowchart illustrating an example of a related-art method of detecting a failure of a current sensor.

FIG. 2 is a flowchart illustrating an example of the current sensor failure detection method of the related art.

Referring to FIG. 2, the current sensor failure detection method of the related art includes step S210 of detecting an angle of a rotor of a motor.

In addition, the current sensor failure detection method of the related art includes step S220 of calculating the size of a current sum vector depending on the angle of the rotor of the motor after the angle of the rotor of the motor is detected.

Specifically, currents flowing through the terminals of the motor may be obtained by the following formulas:

$$Iu=Im \cdot \cos(A),$$

$$Iv=Im \cdot \cos(A-\tfrac{2}{3}\text{pi}), \text{ and}$$

$$Iw=Im \cdot \cos(A+\tfrac{2}{3}\text{pi}),$$

where Im indicates the magnitude of the current sum vector, A indicates the angle of the rotor of the motor, Iu indicates the current flowing through terminal U of the motor, Iv indicates the current flowing through terminal V of the motor, and Iw indicates the current flowing through terminal W of the motor.

Here, in the case in which A is between 330° and 30° and between 150° and 210°, Im is calculated using Illy i.e. Im=Iu/cos A.

In the case in which A is between 30° and 90° and between 210° and 270°, Im is calculated using Iw, i.e. Im=Iu/cos(A+⅔pi).

In the case in which A is between 90° and 150° and between 270° and 330°, Im is calculated using Iv, i.e. Iv=Iu/cos(A−⅔pi).

In addition, the current sensor failure detection method of the related art includes step S230 of calculating an amount of error in each of the phase currents flowing through the terminals U, V, and W, on the basis of the size of the current sum vector calculated in the step S220.

In the case in which A is between 330° and 30° and between 150° and 210°, currents are determined by the following formulas:

$$Du=0,$$

$$Dv=Im \cdot \cos(A-\tfrac{2}{3}\text{pi})-Ivf, \text{ and}$$

$$Dw=Im \cdot \cos(A+\tfrac{2}{3}\text{pi})-Iwf,$$

where Du is an amount of error in the phase current flowing through the terminal U, Dv is an amount of error in the phase current flowing through the terminal V, and Dw is an amount of error in the phase current flowing through the terminal W. Here, Ivf indicates a value of current actually sensed in the terminal V using a current sensor, and Iwf indicates a value of current actually sensed in the terminal W using a current sensor.

In the case in which A is between 30° and 90° and between 210° and 270°, currents are determined by the following formulas:

$$Dw=0,$$

$$Dv=Im \cdot \cos(A-\tfrac{2}{3}\text{pi})-Ivf, \text{ and}$$

$$Du=Im \cdot \cos(A)-Iuf,$$

where Dw is an amount of error in the phase current flowing through the terminal W, Dv is an amount of error in the phase current flowing through the terminal V, and Du is an amount of error in the phase current flowing through the terminal U. Here, Ivf indicates a value of current sensed in the terminal V using a current sensor, and Iuf indicates a value of current sensed in the terminal U using a current sensor.

In the case is which A is between 90° and 150° and between 270° and 330°, currents are determined by the following formulas:

$$Dv=0,$$

$$Du=Im \cdot \cos(A)-Iuf, \text{ and}$$

$Dw=Im\cdot\cos(A+\frac{2}{3}\text{pi})-Iwf,$ where Dv is an amount of error in the phase current flowing through the terminal V, Du is an amount of error in the phase current flowing through the terminal U, and Iaw is an amount of error in the phase current flowing through the terminal W. Here, Iuf indicates a value of current sensed in the terminal U using a current sensor, and Iwf indicates a value of current sensed in the terminal W using a current sensor.

In addition, the current sensor failure detection method of the related art includes step S240 of accumulating an error count depending the amount of error calculated in the step S230.

In addition, the current sensor failure detection method of the related art includes step S250 of detecting a failure depending on the accumulated error count.

However, the use of the current sensor failure detection method of the related art is limited to a case in which the d-axis current of the rotor of the motor is 0, the entire operating areas of the motor cannot be covered, which is problematic.

In addition, the current sensor failure detection method of the related art has a complicated error calculating process, since an error in each phase current is detected in every case depending on the position of the motor. Specifically, in the above-described example, different methods of calculating amounts of error or phase currents are used depending on the three cases (in the case in which A is between 330° and 30° and between 150° and 210°, in the case in which A is between 30° and 90° and between 210° and 270°, and in the case in which A is between 90° and 150° and between 270° and 330°).

In addition, in each case, the accuracy of the amount of error detected may be problematic, since the amount of error of a phase current flowing through one terminal of the three terminals is assumed to be 0 and the amounts of error of phase currents flowing through the remaining terminals are detected using the assumed amount of error in the phase current. The amount of error of one error among the three terminals cannot be guaranteed to be constantly 0.

Accordingly, there are required an apparatus and method for detecting a failure of a current sensor, in which the problems of the current sensor failure detection method of the related art have been overcome.

Figure 3:
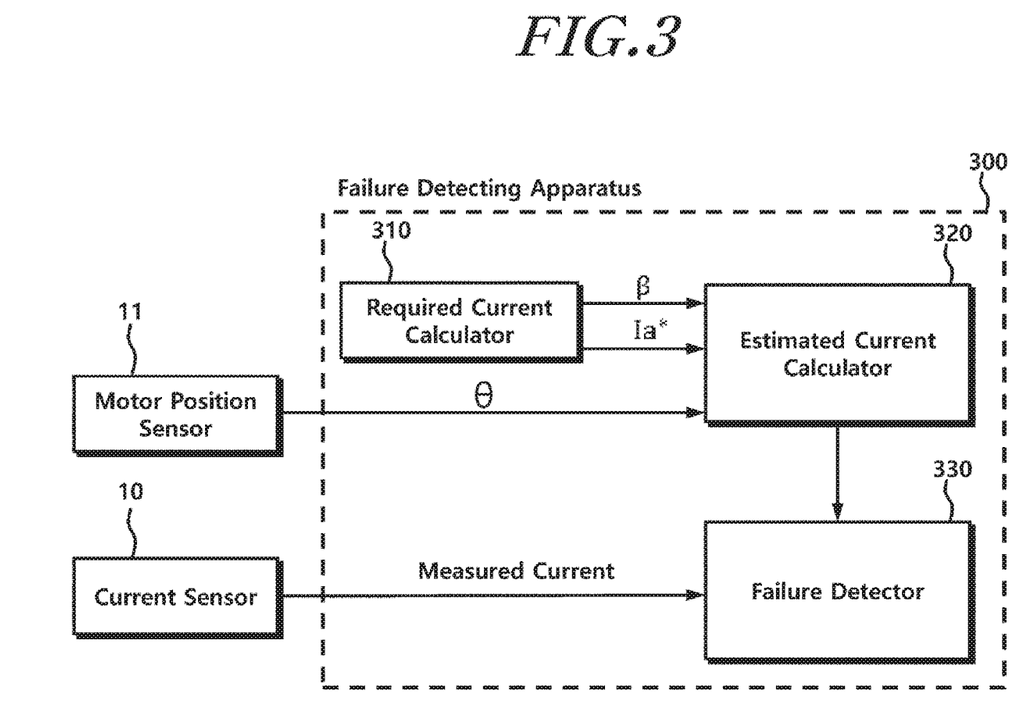
FIG. 3 is a block diagram illustrating components of an apparatus for detecting a failure of a current sensor measuring the magnitude of a current, by which a motor is driven, according to embodiments of the present disclosure.

FIG. 3 is a block diagram illustrating components of an apparatus for detecting a failure of a current sensor measuring the magnitude of a current, by which a motor is driven, according to embodiments of the present disclosure.

Referring to FIG. 3, the apparatus 300 for detecting a failure of a current sensor (hereinafter, also referred to as the "current sensor failure detection apparatus 300") may include a required current calculator 310, an estimated current calculator 320, and a failure detector 330.

The required current calculator 310 calculates a phase β and a magnitude Ia* of a current required for a motor, on the basis of a torque required for the motor.

Here, the torque required for the motor means a torque that the motor is required to generate. A required current Id* in the d axis direction of a magnetic flux of the rotor of the motor and a required current Iq* in the q axis direction of the magnetic flux of the rotor of the motor are determined, depending on the torque required for the motor. The direct (d) axis of the magnetic flux is in the the same direction as the magnetic flux, while the quadrate (q) axis of the magnetic flux is in a direction perpendicular to the magnetic flux.

In an example in which the phase of β of the current required for the motor is obtained, β may be determined on the basis of the required current Id* in the d axis direction of the magnetic flux of the rotor of the motor and the required current Iq* in the q axis direction of the magnetic flux of the rotor of the motor.

In an example in which the magnitude of the required current Ia* of the motor is obtained, Ia* may be determined on the basis of the required current Id* in the d axis direction of the magnetic flux of the rotor of the motor and the required current Iq* in the q axis direction of the magnetic flux of the rotor of the motor, as represented by $\sqrt{(Id^*)^2+(Iq^*)^2}$.

Hereinafter, a method of obtaining β and Ia* using Id* and Iq* will be described with reference to FIG. 4.

Figure 4:
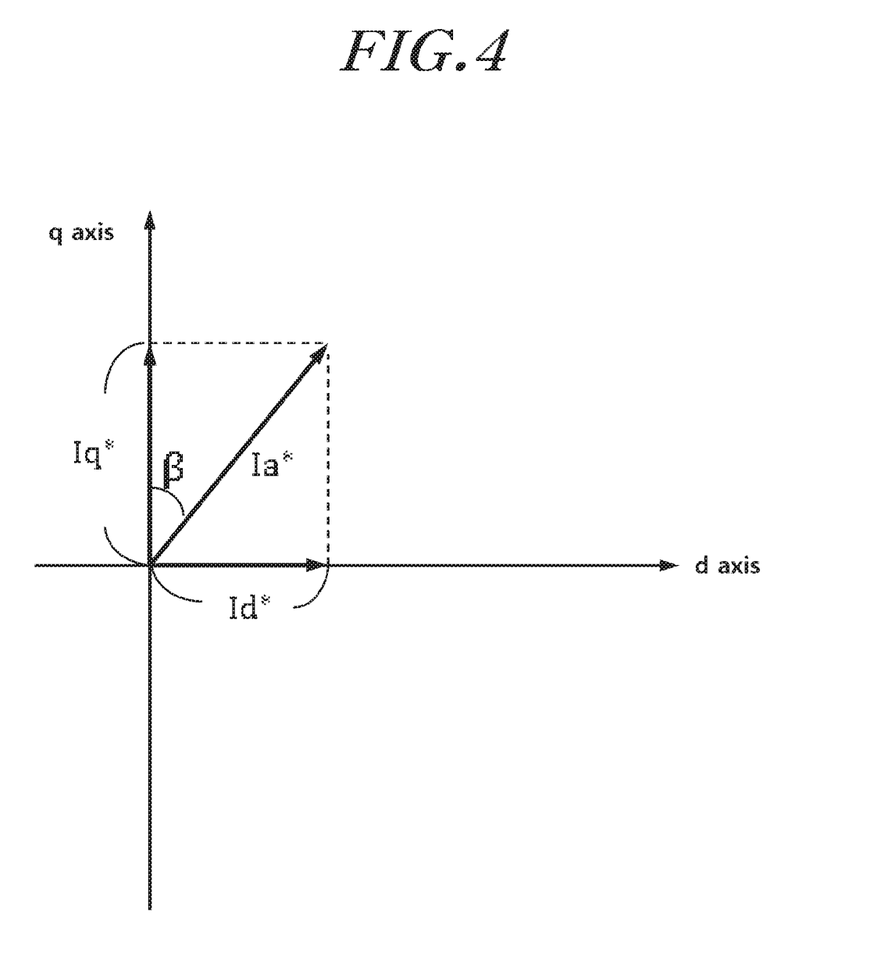
FIG. 4 is a graph illustrating an example of the method of calculating the phase and the magnitude of a current required for the motor according to embodiments of the present disclosure.

FIG. 4 is a graph illustrating an example of the method of calculating the phase and the magnitude of a current required for the motor according to embodiments of the present disclosure.

In the graph, the d axis indicates a direction of the magnetic flux, while the q axis indicates a direction perpendicular to the magnetic flux. Different symbols "−/+" indicate opposite directions. For example, in a case in which required currents in the d axis direction are −30 A and 30 A, the currents have the same magnitude of 30 A and are in opposite directions (having a phase difference of 180°).

Since the d axis is in the same direction as the magnetic flux and the q axis is in the direction perpendicular to the magnetic flux, Id* and Iq* are 90° with respect to each other. Since the current required for the motor is calculated as a vector sum of Id* and Iq*, the size of the vector sum of Id* and Iq* is Ia*. In addition, the angle between the current required for the motor and the q axis is the phase β of the current required for the motor.

In an example, in the case in which Id* is 0 A and Iq* is 100 A, Ia*=$\sqrt{(100)^2+(0)^2}$=100 A and β=0° are obtained.

In another example, in the case in which Id* is −64 A and Iq* is 76 A, Ia*=$\sqrt{(64)^2+(76)^2}$≈100 A and β≈40° are obtained.

As described above, if Id* and Iq* are known, the phase β and the magnitude Ia* of the current required for the motor may be calculated.

The estimated current calculator 320 calculates an estimated current, on the basis of the phase β and the magnitude Ia* of the current required for the motor, calculated by the required current calculator 310, and information regarding the position of the motor.

Here, the information regarding the position of the motor is indicated by θ, i.e. the angle of rotation of the motor. Although values of the information regarding the position of the motor may generally be collected from the motor position sensor, values of the information regarding the position of the motor may be obtained through other routes.

If the phase and magnitude of the current required for the motor and the information regarding the position of the motor are known, the waveform of a current expected to be input to the motor may be derived.

Here, the estimated current is one of the phase current flowing through the terminal U of the motor, the phase current flowing through the terminal V of the motor, and the phase current flowing through the terminal W of the motor. The phase currents flowing through the terminals have a phase difference of 120° from each other, and a sum of the phase currents flowing through the terminals is 0. Accordingly, the estimated current of each of the terminals U, V, and W may be calculated.

The failure detector 330 detects a failure of a current sensor by comparing a value of estimated current, calculated by the estimated current calculator 320, with a value of actual current, measured by the current sensor 10. If the current sensor is connected to the terminal U of the motor, an estimated current of the terminal U may be compared with a current of the terminal V, measured by the current sensor. Likewise, if the current sensor is connected to the terminal V of the motor, an estimated current of the terminal V may be compared to current of the terminal V, measured by the current sensor. If the current sensor is connected to the terminal W of the motor, an estimated current of the terminal W may be compared to current of the terminal W, measured by the current sensor.

Here, a point in time at which the failure detector 330 compares the value of the estimated current with the value of the actual current measured by the current sensor may be determined as follows.

In an example, the failure detector 330 may compare the value of the estimated current with the value of the actual current measured by the current sensor at a position of the motor in which the magnitude of one of phase currents of the estimated current is the greatest, i.e. at the peak of the phase current.

In another example, the failure detector 330 may compare the value of the estimated current with the value of the actual current measured by the current sensor at every predetermined period of calculation.

The failure detector 330 may detect a failure by comparing the value of the estimated current with the value of the actual current measured by the current sensor by a variety of methods.

In an example, the failure detector 330 may detect that the current sensor has failed if a difference between the value of the estimated current and the value of the actual current measured by the current sensor is equal to or greater than a predetermined threshold value.

In another example, the failure detector 330 may increase an error count whenever the difference between the value of the estimated current and the value of the actual current measured by the current sensor equal to or greater than the predetermined threshold value and, if the error count is equal to or greater than a predetermined reference value, detect that the current sensor has failed.

In another example, the failure detector 330 may detect that current sensor has failed if a case, in which the difference between the value of the estimated current and the value of the actual current measured by the current sensor is equal to or greater than the predetermined threshold value, has continuously occurred a predetermined number of times or more.

Figure 5:
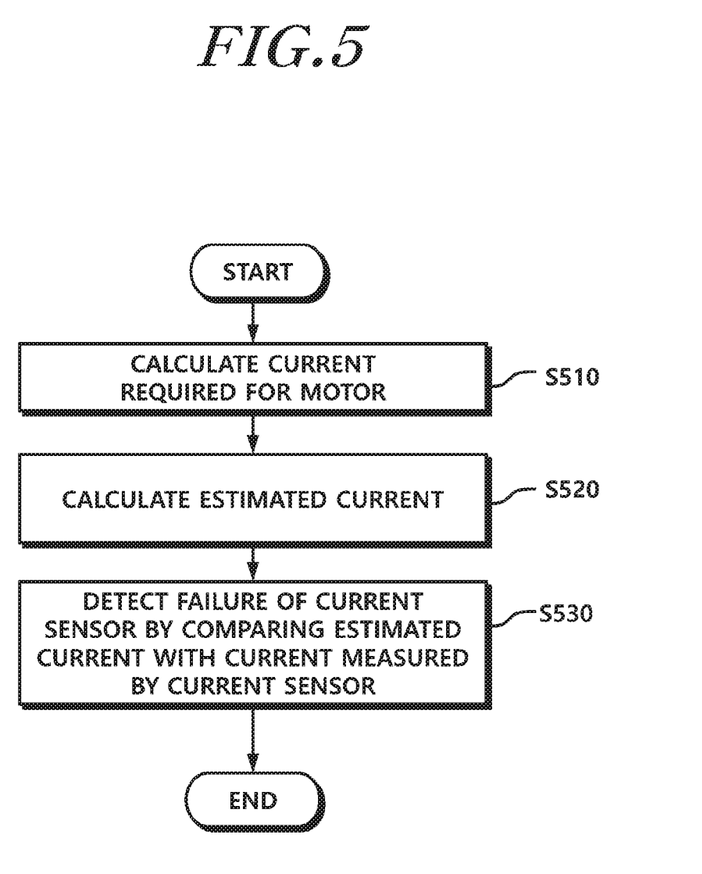
FIG. 5 is a flowchart illustrating a method of detecting a failure of a current sensor measuring the magnitude of a current, by which a motor is driven, according to embodiments of the present disclosure.

FIG. 5 is a flowchart illustrating a method of detecting a failure of a current sensor measuring the magnitude of a current, by which a motor is driven, according to embodiments of the present disclosure.

Hereinafter, an embodiment in which the method is performed by the current sensor failure detection apparatus illustrated in FIG. 3 will be described by way of example.

Referring to FIG. 5, the current sensor failure detection method may include required current calculation step S510 of calculating the phase β and the magnitude Ia* of a current required for the motor, on the basis of a torque required for the motor.

In an example, the required current calculator 310 of the current sensor failure detection apparatus 300 may calculate the phase β and the magnitude Ia* of the current required for the motor, on the basis of the torque required for the motor.

In an example of obtaining the phase β of the current required for the motor, β may be determined on the basis of the required current Id* in the d axis direction of the magnetic flux of the rotor of the motor and the required current Iq* in the q axis direction of the magnetic flux of the rotor of the motor.

In an example of obtaining the magnitude Ia* of the current required for the motor, may be determined on the basis of the required current Id* in the d axis direction of the magnetic flux of the rotor of the motor and the required current Iq* in the q axis direction of the magnetic flux of the rotor of the motor, as represented by $\sqrt{(Id^*)^2+(Iq^*)^2}$.

In addition, the current sensor failure detection method may include estimated current calculation step S520 of calculating an estimated current on the basis of the phase and magnitude of the required current calculated in the step S510 and information regarding the position of the motor.

In addition, the current sensor failure detection method may include failure detection step S530 of detecting a failure of the current sensor by comparing the estimated current calculated in the step S520 and a current measured by the current sensor.

In an example, regarding a point in time at which the estimated current is compared with the current measured by the current sensor, the failure detector 330 of the current sensor failure detection apparatus 300 may compare the value of the estimated current with the value of the actual current measured by the current sensor at a position of the motor in which the magnitude of one of phase currents of the estimated current is the greatest, i.e. at the peak of the phase current. This is because it is possible to most accurately determine the magnitude of the estimated current at that position.

In another example, the failure detector 330 of the current sensor failure detection apparatus 300 may compare the value of the estimated current with the value of the actual current measured by the current sensor at every predetermined period of calculation.

In an example, regarding the method of determining a failure by comparing the estimated current with the value of current measured by the current sensor, the failure detector 330 of the current sensor failure detection apparatus 300 may detect that the current sensor has failed if a difference between the value of the estimated current and the value of the actual current measured by the current sensor is equal to or greater than a predetermined threshold value.

In another example, the failure detector 330 of the current sensor failure detection apparatus 300 may increase an error count whenever the difference between the value of the estimated current and the value of the actual current measured by the current sensor equal to or greater than the predetermined threshold value and, if the error count is equal to or greater than a predetermined reference value, detect that the current sensor has failed.

In another example, the failure detector 330 of the current sensor failure detection apparatus 300 may detect that current sensor has failed if a case, in which the difference between the value of the estimated current and the value of the actual current measured by the current sensor is equal to or greater than the predetermined threshold value, has continuously occurred a predetermined number of times or more.

Although all of the components constituting exemplary embodiments have been described as being combined together or as operating in concert with each other, the present disclosure is not necessarily limited thereto. Rather, one or more components may be selected from the entire components to be combined together and operate in a combined form within the scope of the present disclosure.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. An apparatus for detecting a failure of a current sensor measuring a magnitude of a current, by which a motor is driven, the apparatus comprising:
   a required current calculator calculating a phase and a magnitude of a requiring current required for the motor, in accordance with a torque required for the motor;
   an estimated current calculator calculating an estimated current, based on the phase and the magnitude of the requiring current and position information of the motor; and
   a failure detector detecting a failure of a current sensor by comparing the estimated current with the current measured by the current sensor,
   wherein the failure detector detects that the current sensor has failed if a difference between a value of the estimated current and a value of the current measured by the current sensor is equal to or greater than a predetermined threshold value.

2. The apparatus according to claim 1, wherein the phase of the requiring current is determined in accordance with a required current in a d axis direction and a required current in a q axis direction of a magnetic flux of a rotor of the motor.

3. The apparatus according to claim 1, wherein the magnitude of the requiring current is determined in accordance with a required current in a d axis direction and a required current in a q axis direction of a magnetic flux of a rotor of the motor.

4. The apparatus according to claim 1, wherein the failure detector compares the estimated current with the current measured by the current sensor at a position of the motor in which the magnitude of one of phase currents of the estimated current is the greatest.

5. The apparatus according to claim 1, wherein the failure detector compares the estimated current with the current measured by the current sensor at every predetermined period of calculation.

6. A method of detecting a failure of a current sensor measuring a magnitude of a current, by which a motor is driven, the method comprising:
   calculating a phase and a magnitude of a requiring current required for the motor, in accordance with a torque required for the motor;
   calculating an estimated current, based on the phase and the magnitude of the requiring current and position information of the motor; and
   detecting a failure of a current sensor by comparing the estimated current with the current measured by the current sensor,
   wherein the detection of the failure of the current sensor comprises detecting that the current sensor has failed if a difference between a value of the estimated current and a value of the current measured by the current sensor is equal to or greater than a predetermined threshold value.

7. The method according to claim 6, wherein the phase of the requiring current is determined in accordance with a required current in a d axis direction and a required current in a q axis direction of a magnetic flux of a rotor of the motor.

8. The method according to claim 6, wherein the magnitude of the requiring current is determined in accordance with a required current in a d axis direction and a required current in a q axis direction of a magnetic flux of a rotor of the motor.

9. The method according to claim 6, wherein the detection of the failure of the current sensor comprises comparing the estimated current with the current measured by the current sensor at a position of the motor in which the magnitude of one of phase currents of the estimated current is the greatest.

10. The method according to claim 6, wherein the detection of the failure of the current sensor comprises comparing the estimated current with the current measured by the current sensor at every predetermined period of calculation.

* * * * *